United States Patent [19]

Revirieux

[11] Patent Number: 4,477,774
[45] Date of Patent: Oct. 16, 1984

[54] ELECTRICAL CONTACT DEVICE FOR AN ELECTRONIC CARD PROCESSING APPARATUS

[75] Inventor: Michel Revirieux, Versailles, France

[73] Assignee: Electronique Marcel Dassault, Versailles, France

[21] Appl. No.: 237,564

[22] Filed: Feb. 24, 1981

[30] Foreign Application Priority Data

Feb. 28, 1980 [FR] France ............................ 80 04486

[51] Int. Cl.³ .................... G01R 1/06; G01R 31/02
[52] U.S. Cl. ............................. 324/158 P; 324/72.5
[58] Field of Search ............. 324/158 P, 158 F, 72.5; 339/108 TP

[56] References Cited

U.S. PATENT DOCUMENTS 4,138,643  2/1979  Beck et al. .................... 324/158 P

FOREIGN PATENT DOCUMENTS 2032175  11/1970  France .
2303349   3/1975  France .
53-37077  4/1978  Japan ......................... 324/158 P
1150233   4/1969  United Kingdom .

Primary Examiner—Ernest F. Karlsen
Attorney, Agent, or Firm—Pollock, Vande Sande & Priddy

[57] ABSTRACT

An electrical contact device is provided for use in establishing an electrical connection between an access terminal and an electronic card which may be inserted in the access terminal. The access terminal has contact members which are movable in a direction transverse to the surface of the card to establish electrical connection with terminal contact areas on the card. Prior to operating the electrical connection established between the access terminal and the card for a transaction, the conductive quality of the connection established with each card contact zone is tested by providing each contact member in the form of two pins engaging each contact zone of the card at two respective spaced apart zones and performing a measurement of the ohmic resistance of the circuit thus established through said contact zones. If the resistance measured is too high, a cleaning current may be passed through this circuit. If the resistance measured remains too high, a warning signal is made to appear at the terminal.

5 Claims, 9 Drawing Figures

U.S. Patent Oct. 16, 1984 4,477,774
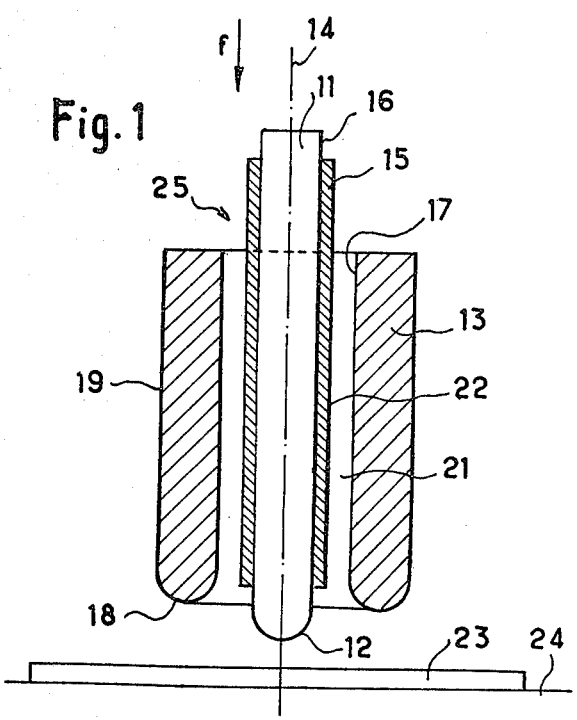
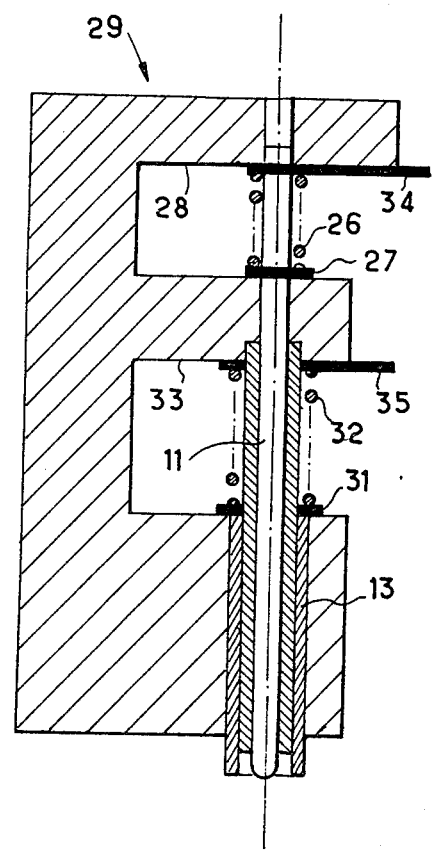
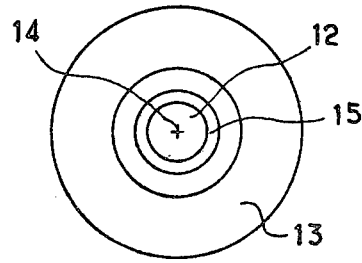

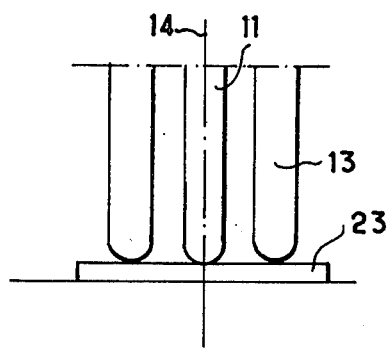
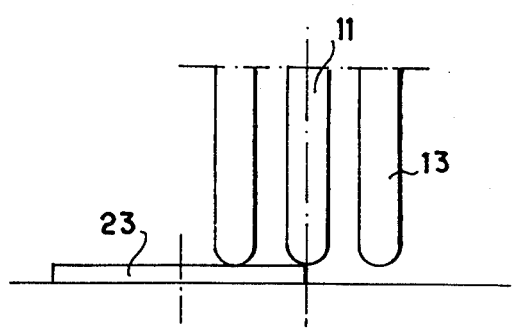
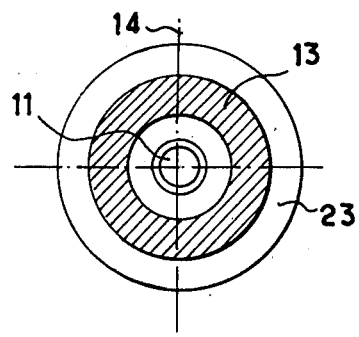
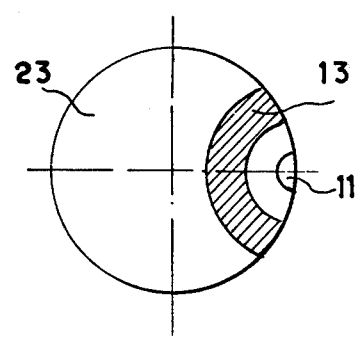
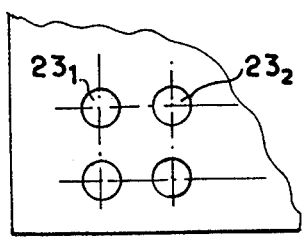
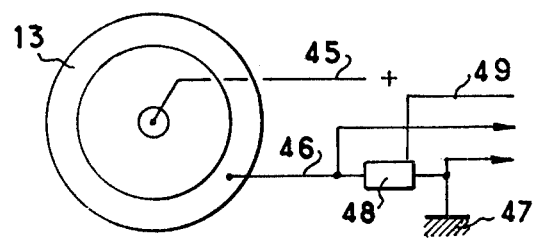

ELECTRICAL CONTACT DEVICE FOR AN ELECTRONIC CARD PROCESSING APPARATUS

BACKGROUND OF THE INVENTION

The invention relates to contact devices, particularly for electronic card processing apparatus.

Electronic cards are known which are, introduced in an apparatus, most often an access terminal, to establish connections allowing electrical signals to be exchanged between, on the one hand, the card and, on the other hand, the terminal, and vice versa, this operation being carried out primarily with a view to checking the card, and also with a view to exchanging data which finally leads to the carrying out of one or multiple book-keeping operations.

A terminal is thus bound to process, during its lifetime, a considerable number of cards, in excess of a hundred thousand, and it is imperative that during all its operational life the electrical connections are provided under perfect conditions.

On the one hand, the fact that the currents to be transmitted between the card and the terminal are relatively very low, and, on the other hand, that the card is carrying several conducting regions, or studs, as a function of the various circuits with which it is equipped and having each a small dimension, have to be taken in account.

Moreover, care should be taken that no confusion arises on account of provisions made for detecting the introduction of a non authorized card between the consequences of such introduction and the situation which may result from a bad connection with the studs of an authorized card.

SUMMARY OF THE INVENTION

The contact device according to the invention meets these various requirements in a simple and economical way, and therefore allows considering its application on a large scale.

The invention is characterized by the fact that a terminal contact device for cooperating with the conductive stud of a card comprises two conductive elements which, during a first phase, are brought in contact with said stud, to allow a check to be made, before the real and effective utilization of the card, of the conductivity quality of its contact stud or studs.

It is only when this checking is completed that the operation provided through the cooperation of the card with the terminal is carried out.

Thus is avoided the risk of drawing an incorrect conclusion from data supplied by the terminal during the card validity check which would result from the bad quality of a contact and not from the fact that the card is not authorized.

According to another aspect of the invention, the invention contemplates a method for establishing an electrical connection between a circuit carried by the card and a circuit included in the terminal, characterized in that during a first phase the card is brought to an operational position relative to the terminal, then a conductive member is brought into contact with a stud or similar connection carried by the card, by effecting a movement substantially perpendicular to the latter, so that contact is established without friction between the stud and the conductor end.

Thus, with the same terminal, one or hundreds of thousands of cards may be processed without wear of its conductive members provided for establishing an electrical connection with the cards presented to it.

In this respect, an object of the invention is to provide an embodiment exhibiting the qualities attached to one and the other of the hereabove characteristics to produce a terminal which is highly reliable in operation while ensuring an extended life.

According to a third aspect, the invention solves problems specific to electronic cards, viz. that of the limitation of the space available on an electronic card for depositing thereon several conductive studs, as well as the inevitable lack of accuracy in the relative positions, on the one hand, of the electrical connection members of the access terminal and, on the other hand, of the conductive studs of the card which these connection members are designed to engage.

The freedom existing for the introduction of the card in the terminal implies by necessity the existence of a clearance within the inlet of a channel or similar opening provided for the reception of the card so as not to compel the user to carry out a number of trials before achieving the introduction of his card.

According to a further aspect of the invention, a conductive member provided in an access terminal for establishing the connection with a stud on an electronic card about an axis, more specifically a connection device in a terminal, comprises a central or axial finger, made of a conductive material, surrounded at a distance by a coaxial conductive sleeve, a jacket made of an insulating material being interposed between the axial finger and the sleeve or conductive annular member, the assembly forming a pair of conductive contact terminal members adapted for engaging the stud in the card and permitting the electrical testing of the conductive quality of the connection established between these contact terminal members and the stud, prior to its effective utilization.

Thus, it is possible to provide an access terminal with a multiplicity of connections within a limited space while accepting a certain flexibility in the position of a card introduced in the terminal.

The invention also contemplates utilizing the pair of conductive terminal members in order to circulate, when a lack of quality of the connection is detected, a current with an intensity appreciably higher than that normally provided for the information exchanges between the card and the access terminal, and vice versa, and this with a view to electrically cleaning or "wetting" the contact.

BRIEF DESCRIPTION OF THE DRAWINGS

The following description which is given by way of example refers to the accompanying drawings wherein:

FIG. 1 is an axial cross-sectional view of a contact device,

FIG. 2 is a corresponding plan view,

FIG. 3 is a schematic view of a support equipped with said contact device,

FIG. 4 is an elevational view of the contact device cooperating with a stud of the electronic card, FIG. 5 is a corresponding plan view, FIG. 6 is a view similar to FIG. 4, but for another relative position of the device and the stud, FIG. 7 is a plan view corresponding to FIG. 6, FIG. 8 is a view of a card portion, FIG. 9 is a view of an installation adapted for cooperating with a contact device.

DETAILED DESCRIPTION OF EMBODIMENTS

A contact device comprises a central finger 11 (FIGS. 1 and 2), cylindrical, with its operating end 12 rounded, advantageously spherically, made of a conductive material, surrounded at a distance by a conductive sleeve 13 or annular member of same axis 14 as finger 11, an insulating member which, in this example, is provided by a jacket 15, being interposed between the outer surface 16 of the finger and the inner surface 17 of the sleeve 13.

In an embodiment, the finger 11 has a diameter of 0.2 mm. The sleeve 13, the operational end portion of which is made by a portion of a toric surface 18, had an outer surface 19 diameter equal to 1 mm and an inner surface 17 diameter equal to 0.6 mm. The thickness of the jacket 15 is of 0.1 mm, thereby leaving a gap 21 between the outer surface 22 of the jacket and the inner surface 17 of the sleeve of 0.1 mm.

Contact device 25 comprising the finger 11 and the sleeve 13 is intended to cooperate with a conductive region 23 or stud carried by an electronic card the body of which is shown at 24.

For establishing the connection, the contact device 25 needs only to be moved towards the card 24, by a movement perpendicular to the latter, as is shown schematically by arrow f, and this until it is applied under pressure.

The application under pressure is preferably elastic and, in the embodiment shown schematically in FIG. 3, the finger 11 is subjected to the action of a spring 26 which bears on the one hand on a flange 27 rigid with said finger and on the other hand against a bearing face 28 of support 29. The conductive sleeve 13 is biased by a second compression spring 32 which is applied mounted between a flange 31 formed on sleeve 13 and a second bearing face 33 of support 29.

Contact of the connection device is then simply achieved by advancing the insulating support 29 towards card 24 until end 12 and edge 18 engage under pressure stud 23. An electrical conductor 34 is connected to finger 11 and an electrical conductor 35 is connected to sleeve 13.

Such a contact device remains operational while authorizing its axis and that of the stud with which it cooperates to be offset with respect to one another.

In the position shown in FIGS. 4 and 5, the axis 14 of the contact device is in the prolongation of axis 14 of the circular stud 23. In the example, said stud has a diameter of 1.27 mm.

In the position shown in FIGS. 6 and 7, the axis 14 is displaced by 0.63 mm relative to axis 41, the connection being nevertheless still achieved.

An access terminal comprises a multiplicity of contact devices such as described hereabove, in register with the studs of the electronic card with which it is adapted to cooperate. The assembly of contact devices occupies a minimum space while remaining operational for a relatively important offset between the centers of said devices and of the card studs presented to it.

FIG. 8 shows very schematically the portion of an electronic card 24 carrying studs $23_1$, $23_2$, etc., having a circular contour, the axes $41_1$, $41_2$, etc. of which are distant by 2.54 mm. The axes 14 of the various connection devices included in the access terminal are spaced by distances of the same value.

In the apparatus shown in FIG. 9, the finger 11 of each contact device of an access terminal is connected via a conductor 45 to a potential source $+V$ and the conductive sleeve 13 is connected via a conductor 46 to the earth 47 through a resistance measuring device 48.

The invention provides that, during a first step, when the contact device is applied against a conductive stud 23, a measurement is carried out by the device 48 of the ohmic resistance of the contact established. If the ohmic resistance is in excess of a predetermined value, a control signal is then applied by a circuit 49 to a device adapted for passing a relatively high "wetting" current through the contacts between the contact device and the stud. If, following the passage of said current, the resistance is still too high, then the device controls the signal appearing at the terminal and warning that one at least of the studs is in an unsatisfactory condition. If on the contrary, the resistance is sufficiently low for the contact to be considered as satisfactory, a control signal is then sent to a circuit authorizing the operation of the unit formed by the terminal and the card introduced into it.

Such a signal is also sent if, as a result of a first trial, it has been established that the contact resistance is sufficiently low, thereby making it unnecessary to send into the contact a "wetting" current.

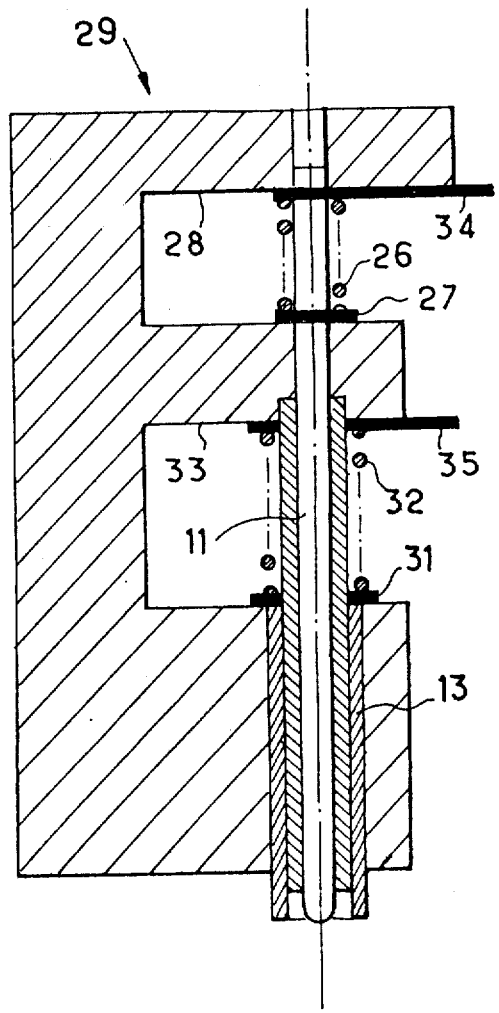

I claim:

1. An electrical contact device for establishing an electrical connection between an electronic card having a plurality of contact terminal areas thereon and an access terminal which receives said card in a receiving means comprising:

a plurality of contact means, each including at least two separate conductive members, one of said members forming a sleeve to a remaining elongated member and insulated therefrom;

a support member for said conductive members, each of said conductive members mounted on said support member for independent movement relative to the support member in a direction transverse to the surface of the card received by said receiving means;

means for independently biasing said conductive members relative to said support member in a direction transverse to and toward the surface of said card to bring each of said two separate conductive members of each of said plurality of contact means into electrical contact with a terminal contact area of the card in said receiving means; and circuit means for passing a current between said conductive members of each of said plurality of contact means through a respective of said terminal contact area.

2. The device of claim 1, wherein said circuit means further includes means for measuring the electrical resistance of an electrically conductive path comprising said terminal contact area of the card.

3. The device of claim 1, wherein the annular space between said conductive members is at least partially filled by an insulating material.

4. The device of claim 3, wherein said insulating material is in the form of an insulating sleeve on the outer face of said conductive elongated member.

5. The device of claim 1, wherein said conductive members have contact ends having a rounded shape.

* * * * *

UNITED STATES PATENT AND TRADEMARK OFFICE
CERTIFICATE OF CORRECTION

PATENT NO. : 4,477,774

DATED : October 16, 1984

INVENTOR(S) : Revirieux

It is certified that error appears in the above-identified patent and that said Letters Patent is hereby corrected as shown below:

The title page should be cancelled to appear as per attached title page.

Signed and Sealed this

Twenty-fifth Day of June 1985

[SEAL]

Attest:

DONALD J. QUIGG

Attesting Officer

Acting Commissioner of Patents and Trademarks

United States Patent [19]

Revirieux

[11] Patent Number: 4,477,774
[45] Date of Patent: Oct. 16, 1984

[54] ELECTRICAL CONTACT DEVICE FOR AN ELECTRONIC CARD PROCESSING APPARATUS

[75] Inventor: Michel Revirieux, Versailles, France

[73] Assignee: Electronique Marcel Dassault, Versailles, France

[21] Appl. No.: 237,564

[22] Filed: Feb. 24, 1981

[30] Foreign Application Priority Data

Feb. 28, 1980 [FR] France .................... 80 04486

[51] Int. Cl.³ .................... G01R 1/06; G01R 31/02
[52] U.S. Cl. .................... 324/158 P; 324/72.5
[58] Field of Search .......... 324/158 P, 158 F, 72.5; 339/108 TP

[56] References Cited

U.S. PATENT DOCUMENTS 4,138,643   2/1979   Beck et al. ............... 324/158 P

FOREIGN PATENT DOCUMENTS 2032175   11/1970   France .
2303349   3/1975    France .
53-37077  4/1978    Japan .................. 324/158 P
1150233   4/1969    United Kingdom .

Primary Examiner—Ernest F. Karlsen
Attorney, Agent, or Firm—Pollock, Vande Sande & Priddy

[57] ABSTRACT

An electrical contact device is provided for use in establishing an electrical connection between an access terminal and an electronic card which may be inserted in the access terminal. The access terminal has contact members which are movable in a direction transverse to the surface of the card to establish electrical connection with terminal contact areas on the card. Prior to operating the electrical connection established between the access terminal and the card for a transaction, the conductive quality of the connection established with each card contact zone is tested by providing each contact member in the form of two pins engaging each contact zone of the card at two respective spaced apart zones and performing a measurement of the ohmic resistance of the circuit thus established through said contact zones. If the resistance measured is too high, a cleaning current may be passed through this circuit. If the resistance measured remains too high, a warning signal is made to appear at the terminal.

5 Claims, 9 Drawing Figures